United States Patent
Kumar

(10) Patent No.: US 10,748,890 B2
(45) Date of Patent: Aug. 18, 2020

(54) NEGATIVE VOLTAGE TOLERANT IO CIRCUITRY FOR IO PAD

(71) Applicant: STMicroelectronics International N.V., Schiphol (NL)

(72) Inventor: Ravinder Kumar, Ambala (IN)

(73) Assignee: STMicroelectronics International N.V., Schiphol (NL)

( * ) Notice: Subject to any disclaimer, the term of this patent is extended or adjusted under 35 U.S.C. 154(b) by 479 days.

(21) Appl. No.: 15/475,270

(22) Filed: Mar. 31, 2017

(65) Prior Publication Data

US 2018/0287379 A1  Oct. 4, 2018

(51) Int. Cl.
| H03K 19/01 | (2006.01) |
| H01L 27/02 | (2006.01) |
| H03K 19/0175 | (2006.01) |
| H01L 29/78 | (2006.01) |

(52) U.S. Cl.
CPC ...... *H01L 27/0266* (2013.01); *H01L 29/7802* (2013.01); *H03K 19/017509* (2013.01); *H01L 29/7801* (2013.01)

(58) Field of Classification Search
CPC .......... H02H 11/003; H03K 19/107509; H01L 27/0266
USPC .............. 361/59, 91, 77, 91.5; 327/108–112, 327/309–313
See application file for complete search history.

(56) References Cited

U.S. PATENT DOCUMENTS

| 6,037,828 | A | * | 3/2000 | Fotouhi | .............. | H03K 19/1731 |
| | | | | | | 326/82 |
| 6,275,094 | B1 | * | 8/2001 | Cranford, Jr. | ...... | H03K 19/0027 |
| | | | | | | 327/307 |
| 6,566,911 | B1 | * | 5/2003 | Moyer | ........... | H03K 19/018585 |
| | | | | | | 326/112 |
| 2006/0232313 | A1 | * | 10/2006 | Favard | ................. | H03K 3/3565 |
| | | | | | | 327/205 |
| 2008/0272952 | A1 | * | 11/2008 | Wood | .................... | G04F 10/005 |
| | | | | | | 341/166 |
| 2009/0315624 | A1 | * | 12/2009 | Chow | ....................... | H03F 1/34 |
| | | | | | | 330/291 |
| 2011/0012646 | A1 | * | 1/2011 | Yadav | ............ | H03K 19/018521 |
| | | | | | | 327/109 |
| 2015/0070070 | A1 | * | 3/2015 | Pan | ................ | H03K 19/018585 |
| | | | | | | 327/333 |

* cited by examiner

*Primary Examiner* — Tuan T Dinh
(74) *Attorney, Agent, or Firm* — Crowe & Dunlevy

(57) ABSTRACT

Disclosed herein is an electronic device including an IO node, with a receiver coupled to receive input from the IO node. A transmitter driver has a first n-channel DMOS with a source coupled to the IO node. A pass gate circuit decouples the IO node from the receiver based upon presence of a negative voltage at the IO node and couples the IO node to the receiver based upon lack of presence of the negative voltage at the IO node. A transmit protection circuit applies the negative voltage from the IO node to the gate and bulk of the first n-channel DMOS based upon the presence of the negative voltage at the IO node.

17 Claims, 3 Drawing Sheets

NEGATIVE VOLTAGE TOLERANT IO CIRCUITRY FOR IO PAD

TECHNICAL FIELD

This disclosure is directed to negative voltage tolerant IO circuitry for an IO pad of an integrated circuit, and in particular, to an IO pad that has a negative voltage externally applied thereto at times during normal operation, such as in a configuration utilizing power factor correction.

BACKGROUND

An input output (IO) pad of an integrated circuit for use in serial communication has both a receiver circuit and a transmitter circuit associated therewith. So as to help control power consumption in such circuits, it is desirable to use power factor correction circuitry to help raise the power factor as close to ideal as possible.

However, power factor correction circuitry may result in negative voltages being externally applied to the IO pad. This can result in damage to the transistors in the receiver and transmitter circuits associated with the IO pad. In particular, the gate oxides of the transistors can be damaged, affecting the proper operation of the transistors, ultimately rendering the IO pad inoperable. This can in turn render certain functions of the electronic device which the integrated circuit inoperable.

Consequently, development of IO circuitry, for an IO pad of an integrated circuit, resistant to negative voltages is needed.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

Disclosed herein is an electronic device including an IO node, with a receiver circuit coupled to receive an input signal from the IO node. A transmitter driver circuit is coupled to send an output signal to the IO node. A receiver protection circuit is configured to decouple the IO node from the receiver circuit based upon presence of a negative voltage at the IO node. A transmitter protection is circuit configured to prevent damage to the transmit driver circuit by applying the negative voltage from the IO node to a device terminal within the transmitter driver circuit that is not directly coupled to the IO node, based upon the presence of the negative voltage at the IO node.

The transmitter driver circuit may include a first n-channel transistor having a gate and a source coupled to the IO node, and the device terminal within the transmitter driver circuit may be the gate of the first n-channel transistor.

The transmitter protection circuit may include a second n-channel transistor having a source coupled to the IO node, a drain coupled to the gate of the first n-channel transistor, and a gate coupled to a first control signal that is negative when the negative voltage is present at the IO node.

The transmitter protection circuit may also include a first p-channel transistor having a source coupled to a supply voltage, a drain coupled to the gate of the first n-channel transistor, and a gate coupled to a second control signal that is positive when the negative voltage is present at the IO node.

At least one of the second n-channel transistor and the first p-channel transistor may be a DMOS device.

The first control signal may be negative when the negative voltage is present at the IO node and may be at ground when the negative voltage is not present at the IO node.

A control voltage generation circuit may be configured to generate the first control signal. The control voltage generation circuit may include a third n-channel transistor having a source coupled to the IO node, a drain, and a gate coupled to the drain of the third n-channel transistor. A fourth n-channel transistor may have a source coupled to the drain of the third n-channel transistor, a drain, and a gate coupled to the drain of the fourth n-channel transistor. A fifth n-channel transistor may have a drain coupled to the drain of the fourth n-channel transistor, a gate coupled to ground, and a source coupled to an output node. A sixth n-channel transistor may have a source coupled to the output node, a drain, and a gate coupled to the drain of the sixth n-channel transistor. A seventh n-channel transistor may have a drain coupled to the drain of the sixth n-channel transistor, a source coupled to ground, and a gate coupled to receive a fourth control signal that is at ground when the negative voltage is present at the IO node. The first control signal may be generated at the output node of the control voltage generation circuit.

The receiver protection circuit may include a pass gate coupled between the IO node and the receiver circuit, with the pass gate configured to decouple the IO node from the receiver circuit based upon the presence of the negative voltage at the IO node and to couple the IO node to the receiver circuit based upon a lack of presence of the negative voltage at the IO node.

The pass gate may include a first n-channel transistor having a source coupled to the IO node, a drain coupled to the receiver circuit, and a gate coupled to a third control signal that is negative when the negative voltage is present at the IO node. A first p-channel transistor may have a drain coupled to the source of the first n-channel transistor, a source coupled to the drain of the first n-channel transistor, and a gate coupled to receive a second control signal that is positive when the negative voltage is present at the IO node.

The first n-channel transistor may have a body, and the receiver protection circuit may include a body protection circuit for the first n-channel transistor. The body protection circuit may be configured to bias the body of the first n-channel transistor to the negative voltage when the negative voltage is present at the IO node and to bias the body of the first n-channel transistor to ground when the negative voltage is not present at the IO node.

The body protection circuit includes a second n-channel transistor having a drain coupled to the IO node, a source coupled to the body of the first n-channel transistor, and a gate coupled to receive a first control signal that is negative when the negative voltage is present at the IO node.

The body protection circuit may include a second p-channel transistor having a source coupled to a supply voltage, a gate coupled to a second control signal that is positive when the negative voltage is present at the IO node, and a drain. A third p-channel transistor may have a source coupled to the drain of the second p-channel transistor, a drain coupled to the body of the first n-channel transistor, and a gate coupled to the supply voltage. A third n-channel transistor may have a source coupled to the drain of the third p-channel transistor, a drain, and a gate coupled to receive the third control signal. A fourth n-channel transistor may have a drain coupled to the drain of the third n-channel transistor, a source coupled to ground, and a gate coupled to receive a fourth control signal that is at ground when the negative voltage is present at the IO node.

The body protection circuit may also include a fourth p-channel transistor having a drain coupled to the gate of the third n-channel transistor, a source coupled to the supply voltage, and a gate coupled to receive the second control signal. A fifth n-channel transistor may have a source coupled to the IO node, a drain coupled to the gate of the third n-channel transistor, and a gate coupled to receive the first control signal. The fourth control signal may be generated at the drain of the fifth n-channel transistor.

A method aspect includes decoupling the IO node from a receiver based upon the detection of the negative voltage at the IO node, and applying the negative voltage from the IO node to a device terminal and bulk that is not directly coupled to the IO node and is within a transmitter driver, based upon the detection of the negative voltage at the IO node.

Decoupling the IO node from the receiver may include opening a pass gate coupled between the IO node and the receiver.

Applying the negative voltage from the IO node to the device terminal that is not coupled to the IO node and is within the transmit driver may be applying the negative voltage to a first n-channel transistor within the transmitter driver.

DETAILED DESCRIPTION

One or more embodiments of the present disclosure will be described below. These described embodiments are only examples of the presently disclosed techniques. Additionally, in an effort to provide a concise description, some features of an actual implementation may not be described in the specification. When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements.

Figure 1:
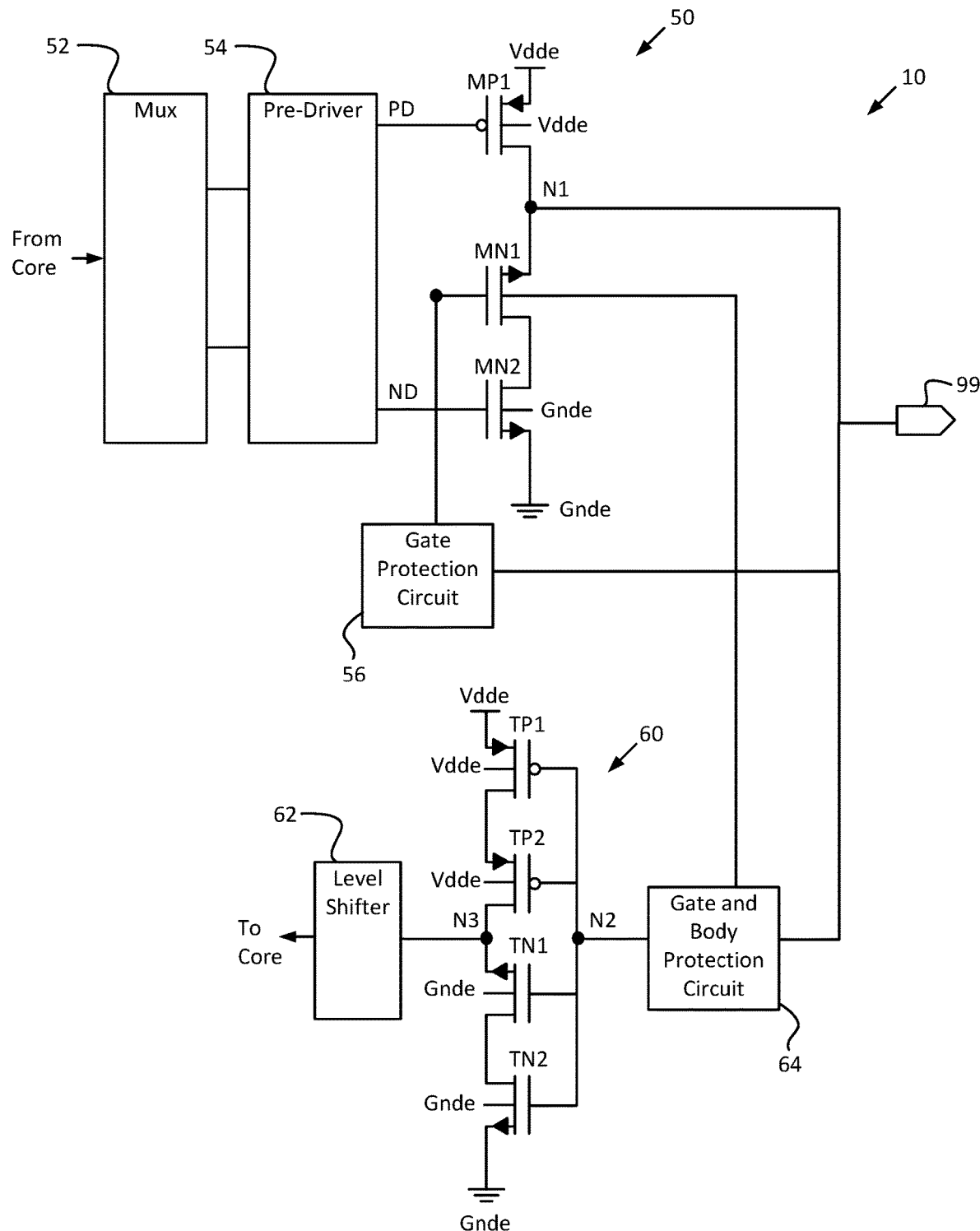
FIG. 1 is a schematic block diagram of IO circuitry, for an IO pad, capable of withstanding negative voltages.

With initial reference to FIG. 1, IO circuitry 10 for an IO pad 99 is now described. The IO circuitry includes transmitter circuitry 50 and receiver circuitry 60.

The transmitter circuitry 50 includes a multiplexer 52 configured to selectively pass data signals to a pre-driver 54, which in turn generates p-channel and n-channel control signals PD and ND. The transmitter circuitry 50 further includes a p-channel transistor MP1 having its source coupled to a supply voltage Vdde, its drain coupled to node N1, its gate biased by control signal PD, and its bulk coupled to the supply voltage Vdde. N-channel transistor MN1 has its source coupled to node N1 and its bulk coupled to node N5. N-channel transistor MN2 has its drain coupled to the drain of N-channel transistor MN1, its source coupled to ground Gnde, its bulk coupled to ground Gnde, and its gate biased by the control signal ND. Gate protection circuit 56 is between the gate of n-channel transistor MN1 and IO pad 99 and serves to protect the gate of n-channel transistor MN1 from negative voltages applied to the IO pad 99. Gate protection circuit 56 also provides the normal bias for n-channel transistor MN1 in the absence of a negative voltage at IO pad 99.

The receiver circuitry 60 includes p-channel transistor TP1 having its source coupled to the supply voltage Vdde, its bulk coupled to the supply voltage Vdde, and its gate coupled to node N2. P-channel transistor TP2 has its source coupled to the drain of p-channel transistor TP1, its bulk coupled to the supply voltage Vdde, its drain coupled to node N3, and its gate coupled to node N2. N-channel transistor TN1 has its source coupled to node N3, its bulk coupled to ground Gnde, and its gate coupled to node N2. N-channel transistor TN2 has its drain coupled to the drain of n-channel transistor TN1, its source coupled to ground, its bulk coupled to ground Gnde, and its gate coupled to node N2. A gate and body protection circuitry 64 is coupled between node N2 and the IO pad 69, and serves to protect transistors TP1, TP2, TN1, TN2 from negative voltages applied to the IO pad 99. A level shifter 62 is coupled to node N3 and serves to change the voltage of received signals to a suitable voltage for on-chip usage.

Figure 2:
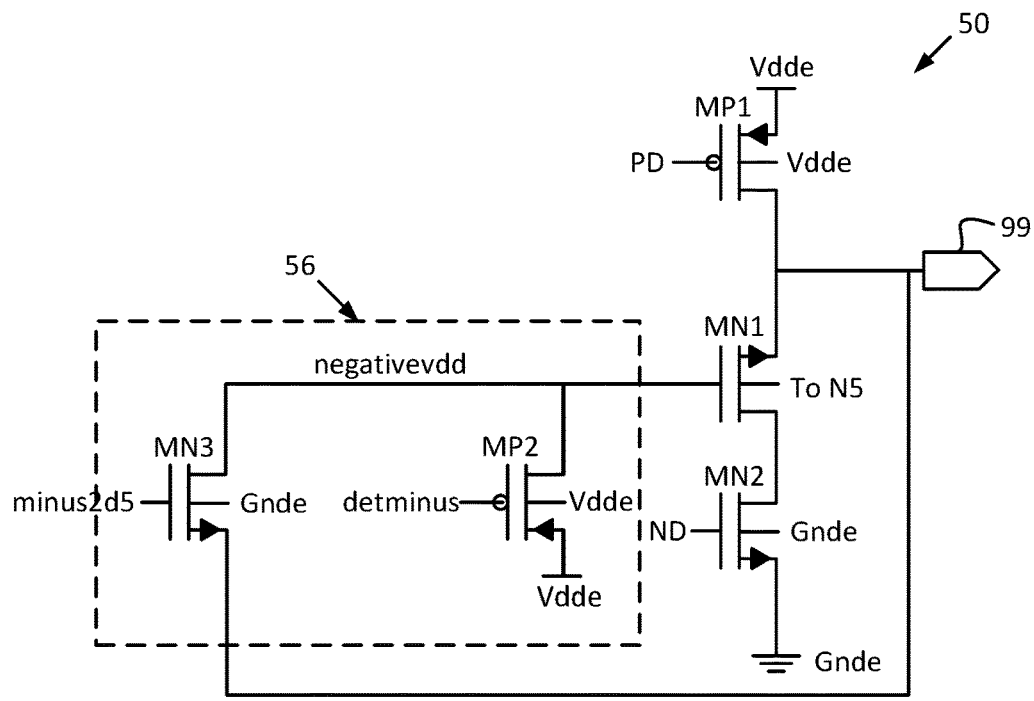
FIG. 2 is a schematic of the transmit protection circuitry of FIG. 1.

With additional reference to FIG. 2, the gate protection circuit 56 is now described. The gate protection circuit 56 includes p-channel transistor MP2 having its source coupled to vdde, its drain coupled to the gate of n-channel transistor MN1, its bulk coupled to the supply voltage Vdde, and its gate biased by control voltage detminus. N-channel transistor MN3 has its source coupled to the IO pad 99, its drain coupled to the gate of n-channel transistor MN1, its bulk coupled to ground, and its gate coupled to be biased by control voltage minus2d5. Control voltage detminus is high (for example, at Vdde) when the voltage on the IO pad 99 is negative, and control voltage minus2d5 is negative when the voltage on the IO pad 99 is negative. Control voltage detminus is low (for example, at Gnde) when the voltage on the IO pad 99 is not negative, and control voltage minus2d5 is also low when the voltage on the IO pad 99 is not negative. The control signal negativevdd is produced by n-channel transistor MN3 when the IO pad 99 is negative, and is produced by the p-channel transistor MP2 when the IO pad 99 is not negative, and is used to bias the gate of n-channel transistor MN1. Control signal negativevdd is equal to the voltage on the IO pad 99 (passed through MN3) when the voltage on the IO pad 99 is negative, and is high (MP2) passed through when the voltage on the IO pad 99 is not negative.

Figure 3:
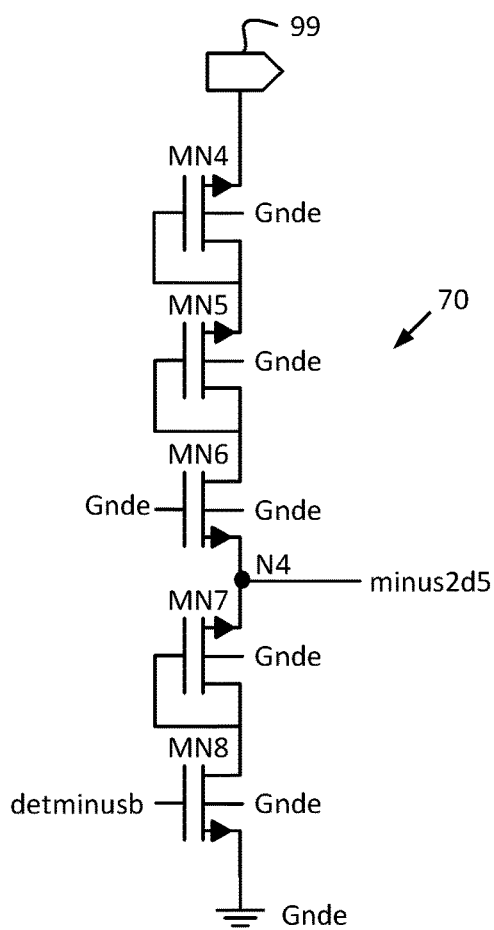
FIG. 3 is a schematic of circuitry generating the first control signal used in FIG. 2.

Referring now to FIG. 3, a circuit 70 for generating the control signal minus2d5 is now described. The circuit 70 includes a diode-coupled n-channel transistor MN4 having its source coupled to the IO pad 99, its gate coupled to its drain, and its bulk coupled to ground Gnde. Diode-coupled n-channel transistor MN5 has its source coupled to the drain of n-channel transistor MN4, its gate coupled to its drain, and its bulk coupled to ground Gnde. N-channel transistor MN6 has its drain coupled to the drain of n-channel transistor MN8, its source coupled to node N4, its gate coupled to ground Gnde, and its bulk coupled to ground Gnde. Diode coupled n-channel transistor MN7 has its source coupled to node N4, its gate coupled to its drain, and its bulk coupled to ground Gnde. N-channel transistor MN8 has its drain coupled to the drain of n-channel transistor MN7, its source coupled to ground Gnde, its gate coupled to be biased by control signal detminusb, and its bulk coupled to ground Gnde.

Operation of the gate protection circuit 56 will now be described with reference to FIGS. 2-3. When a negative voltage is detected at the IO pad 99, control voltage detminusb is low, switching off n-channel transistor MN8, allowing the n-channel transistors MN4-MN6 to pull node N4 to a negative voltage that is greater than the negative voltage at the IO pad 99. For example, if the negative voltage at the IO pad 99 is −7 V, then the control signal minus2d5 produced at node N4 is −2.5 V.

When the negative voltage is detected at the IO pad 99, control signal detminus is high, turning off p-channel transistor MP2. As stated, control voltage minus2d5 will be negative, turning on n-channel transistor MN3 due to the gate to source voltage thereof being greater than its threshold voltage, thereby pulling the gate of n-channel transistor MN1 to the voltage at the IO pad 99. Since the gate and source of n-channel transistor MN1 will both be biased to the voltage at the IO pad 99, n-channel transistor MN1 will turn off, ensuring that n-channel transistor MN1 does not have a gate to source voltage greater than a safe amount.

On the other hand, when a negative voltage is not detected at the IO pad 99, control signal detminusb will be high, turning on n-channel transistor MN8, thereby pulling node N4 and thus the control signal minus2d5 to ground. This will turn off n-channel transistor MN3. As stated, control signal detminus will be low when a negative voltage is not detected at the IO pad 99, thereby switching on p-channel transistor MP2, and pulling the gate of n-channel transistor MN1 to the supply voltage Vdde. This turns on n-channel transistor MN1, allowing normal operation of p-channel transistor MP1 and n-channel transistor MN2 to occur.

Figure 4:
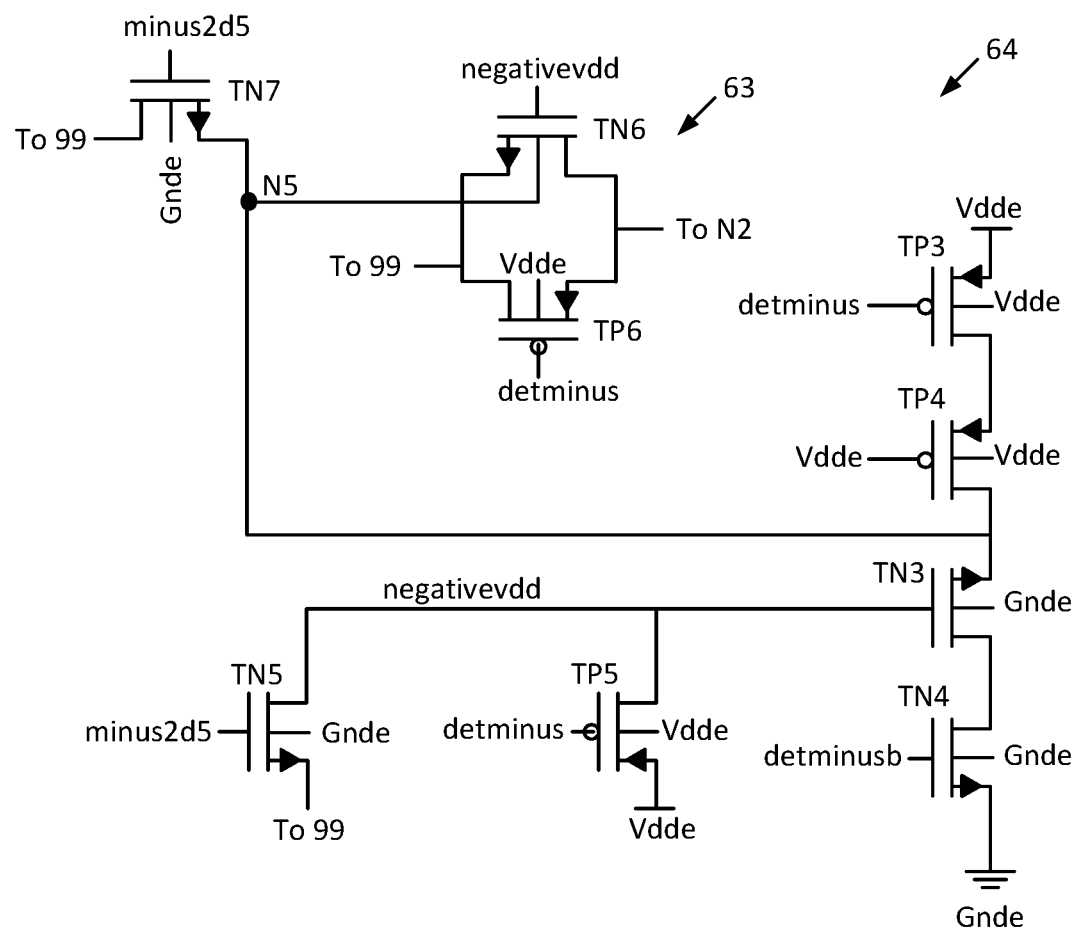
FIG. 4 is a schematic of the receiver protection circuitry of FIG. 1.

With additional reference to FIG. 4, the gate and body protection circuit 64 will now be described. The gate and body protection circuit 64 includes a pass gate 63 coupled between IO pad 99 and node N2 of the receiver 60.

Pass gate 63 is comprised of n-channel transistor TN6 having its source coupled to IO pad 99, its drain coupled to receiver 60, its gate biased by control signal negativevdd, and its bulk coupled to node N5. Pass gate 63 also includes p-channel transistor TP6 having its source coupled to node N2 of the receiver 60, its drain coupled to IO pad 99, its bulk coupled to the supply voltage Vdde, and its gate biased by control signal detminus.

N-channel transistor TN7 has its source coupled to node N5, its drain coupled to IO pad 99, its bulk coupled to ground Gnde, and its gate biased by control signal minus2d5. P-channel transistor TP4 has its drain coupled to node N5, its bulk coupled to the supply voltage Vdde, and its gate biased by the supply voltage Vdde. P-channel transistor TP3 has its source coupled to the supply voltage Vdde, its drain coupled to the source of p-channel transistor TP4, its bulk coupled to the supply voltage Vdde, and its gate coupled to control signal detminus. N-channel transistor TN3 has its source coupled to node N5, and its bulk coupled to ground Gnde. N-channel transistor TN4 has its source coupled to ground Gnde, its drain coupled to the drain of n-channel transistor TN3, its bulk coupled to ground Gnde, and its gate biased by control signal detminusb. P-channel transistor TP5 has its source coupled to the supply voltage Vdde, its drain coupled to the gate of n-channel transistor TN3, its gate biased by control signal detminus, and its bulk coupled to the supply voltage Vdde. N-channel transistor TN5 has its source coupled to IO node 99, its drain coupled to the gate of n-channel transistor TN3, its bulk coupled to ground Gnde, and its gate biased by control signal minus2d5.

Operation of the gate and body protection circuit 64 will now be described in connection with FIG. 3. When a negative voltage is detected at the IO pad 99, control voltage detminusb is low, switching off n-channel transistor MN8, allowing the n-channel transistors MN4-MN6 to pull node N4 to a negative voltage that is greater than the negative voltage at the IO pad 99. For example, if the negative voltage at the IO pad 99 is −7 V, then the control signal minus2d5 produced at node N4 is −2.5 V.

This turns on n-channel transistor TN5. Detminus will be high, turning off p-channel transistor TP5. This will serve to generate control signal negativevdd on the gate of n-channel transistor TN3 to the voltage present at IO pad 99 through TN5.

Since negativevdd will be negative and detminus will be high, n-channel transistor TN6 and p-channel transistor TP6 will be off, thereby decoupling IO pad 99 from receiver 60. Minus2d5 being negative but greater than the voltage at IO pad 99 will result in n-channel transistor TN7 turning on, pulling node N5 to the voltage at IO pad 99. Node N5 being at the voltage of IO pad 99 will mean that the gate and source voltage of n-channel transistor TN3 will be the same, and the device will be off, protecting it from the negative voltage. Node N5 being at the voltage of IO pad 99 will also mean that the bulk of n-channel transistor TN6 will be at the voltage of IO pad 99, protecting the bulk.

On the other hand, when a negative voltage is not present at IO pad 99, control signal detminusb will be high, turning on n-channel transistor MN8, thereby pulling node N4 and thus the control signal minus2d5 to ground. This turns off n-channel transistor TN5, and control signal detminus will be low, turning on p-channel transistor TP5. This will in turn generate control signal negativevdd as high on the gate of n-channel transistor TN3. Control signal negativevdd being high and control signal detminus being low will serve to turn on both n-channel transistor TN6 and p-channel transistor TP6, thereby coupling the IO pad 99 to the receiver 60. Node N5 also provide protection to the body of n-channel transistor MN1 of transmitter circuitry 50

The p-channel and n-channel transistors described herein may be implemented as DMOS transistors, although MOSFETS may be used in some cases. The p-channel DMOS devices may be 15 V devices, while the n-channel DMOS devices may be 10 V or 15V devices.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. An electronic device, comprising:
   an input output (IO) node;
   a receiver circuit coupled to receive an input signal from the IO node;
   a transmitter driver circuit coupled to send an output signal to the IO node;
   a receiver protection circuit configured to decouple the IO node from the receiver circuit based upon presence of a negative voltage at the IO node; and
   a transmitter protection circuit configured to prevent damage to the transmit driver circuit by applying the negative voltage from the IO node to a device terminal within the transmit driver circuit that is not directly coupled to the IO node, based upon the presence of the negative voltage at the IO node;

wherein the transmitter driver circuit comprises a first n-channel transistor having a gate and a source coupled to the IO node, a second n-channel transistor having a source coupled to the IO node, a drain coupled to the gate of the first n-channel transistor, and a gate coupled to a first control signal that is negative when the negative voltage is present at the IO node; and wherein the device terminal within the transmitter driver circuit is the gate of the first n-channel transistor.

2. The electronic device of claim 1, wherein the transmit protection circuit further comprises a first p-channel transistor having a source coupled to a supply voltage, a drain coupled to the gate of the first n-channel transistor, and a gate coupled to a second control signal that is positive when the negative voltage is present at the IO node.

3. The electronic device of claim 1, wherein the first control signal is negative when the negative voltage is present at the IO node and is at ground when the negative voltage is not present at the IO node.

4. The electronic device of claim 1, wherein the receiver protection circuit comprises a pass gate coupled between the IO node and the receiver circuit, the pass gate configured to decouple the IO node from the receiver circuit based upon the presence of the negative voltage to the IO node and to couple the IO node to the receiver circuit in response to lack of detection of application of the negative voltage to the IO node.

5. The electronic device of claim 1, wherein the transmitter protection circuit prevents damage to the transmit driver circuit by directly electrically applying the negative voltage from the IO node to the device terminal within the transmit driver circuit.

6. The electronic device of claim 2, wherein at least one of the second n-channel transistor and the first p-channel transistor is a DMOS device.

7. The electronic device of claim 3, further comprising a control voltage generation circuit configured to generate the first control signal; and wherein the control voltage generation circuit comprises:
a third n-channel transistor having a source coupled to the IO node, a drain, and a gate coupled to the drain of the third n-channel transistor;
a fourth n-channel transistor having a source coupled to the drain of the third n-channel transistor, a drain, and a gate coupled to the drain of the fourth n-channel transistor;
a fifth n-channel transistor having a drain coupled to the drain of the fourth n-channel transistor, a gate coupled to ground, and a source coupled to an output node;
a sixth n-channel transistor having a source coupled to the output node, a drain, and a gate coupled of the drain of the sixth n-channel transistor; and
a seventh n-channel transistor having a drain coupled to the drain of the sixth n-channel transistor, a source coupled to ground, and a gate coupled to receive a fourth control signal that is at ground when the negative voltage is present at the IO node;
wherein the first control signal is generated at the output node of the control voltage generation circuit.

8. An electronic device, comprising:
an input output (IO) node;
a receiver circuit coupled to receive an input signal from the IO node;
a transmitter driver circuit coupled to send an output signal to the IO node;
a receiver protection circuit configured to decouple the IO node from the receiver circuit based upon presence of a negative voltage at the IO node, wherein the receiver protection circuit comprises a pass gate coupled between the IO node and the receiver circuit, the pass gate configured to decouple the IO node from the receiver circuit based upon the presence of the negative voltage to the IO node and to couple the IO node to the receiver circuit in response to lack of detection of application of the negative voltage to the IO node,
wherein the pass gate comprises:
a first n-channel transistor having a source coupled to the IO node, a drain coupled to the receiver circuit, and a gate coupled to a third control signal that is negative when the negative voltage is present at the IO node; and
a first p-channel transistor having a drain coupled to the source of the first n-channel transistor, a source coupled to the drain of the first n-channel transistor, and a gate coupled to receive a second control signal that is positive when the negative voltage is present at the IO node; and
a transmitter protection circuit configured to prevent damage to the transmit driver circuit by applying the negative voltage from the IO node to a device terminal within the transmit driver circuit that is not directly coupled to the IO node, based upon the presence of the negative voltage at the IO node.

9. The electronic device of claim 8, wherein the first n-channel transistor has a body; and wherein the receiver protection circuit further comprises a body protection circuit for the first n-channel transistor.

10. The electronic device of claim 9, wherein the body protection circuit is configured to bias the body of the first n-channel transistor to the negative voltage when the negative voltage is present at the TO node and to bias the body of the first n-channel transistor to ground when the negative voltage is not present at the TO node.

11. The electronic device of claim 10, wherein the body protection circuit comprises:
a second n-channel transistor having a drain coupled to the TO node, a source coupled to the body of the first n-channel transistor, and a gate coupled to receive a first control signal that is negative when the negative voltage is present at the TO node.

12. The electronic device of claim 11, wherein the body protection circuit further comprises:
a second p-channel transistor having a source coupled to a supply voltage, a gate coupled to a second control signal that is positive when the negative voltage is present at the TO node, and a drain;
a third p-channel transistor having a source coupled to the drain of the second p-channel transistor, a drain coupled to the body of the first n-channel transistor, and a gate coupled to the supply voltage;
a third n-channel transistor having a source coupled to the drain of the third p-channel transistor, a drain, and a gate coupled to receive the third control signal; and
a fourth n-channel transistor having a drain coupled to the drain of the third n-channel transistor, a source coupled to ground, and a gate coupled to receive a fourth control signal that is at ground when the negative voltage is present at the TO node.

13. The electronic device of claim 12, wherein the body protection circuit further comprises:
a fourth p-channel transistor having a drain coupled to the gate of the third n-channel transistor, a source coupled to the supply voltage, and a gate coupled to receive the second control signal; and a fifth n-channel transistor having a source coupled to the TO node, a drain coupled to the gate of the third n-channel transistor, and a gate coupled to receive the first control signal;

wherein the fourth control signal is generated at the drain of the fifth n-channel transistor.

14. An electronic device, comprising:

an input output (IO) node;

a receiver coupled to receive input from the IO node;

a transmitter driver comprising a first n-channel DMOS having a source coupled to the IO node, and a gate;

a pass gate circuit configured to decouple the IO node from the receiver based upon presence of a negative voltage at the IO node and couples the IO node to the receiver based upon lack of presence of the negative voltage at the IO node; and a transmit protection circuit configured to apply the negative voltage from the IO node to the gate of the first n-channel DMOS based upon the presence of the negative voltage at the IO node;

wherein the transmit protection circuit comprises a second n-channel DMOS having a source coupled to the IO node, a drain coupled to the gate of the first n-channel DMOS, a gate coupled to a first control signal that is negative when the negative voltage is present at the IO node, a first p-channel DMOS having a source coupled to a supply voltage, a drain coupled to the gate of the first n-channel DMOS, and a gate coupled to a second control signal that is positive when the negative voltage is present at the IO node.

15. The electronic device of claim 14, wherein the transmit protection circuit directly electrically applied the negative voltage from the IO node to the gate of the first n-channel DMOS.

16. An electronic device, comprising:

an input output (IO) node;

a receiver coupled to receive input from the IO node;

a transmitter driver comprising a first n-channel DMOS having a source coupled to the IO node, and a gate;

a pass gate circuit configured to decouple the IO node from the receiver based upon presence of a negative voltage at the IO node and couples the IO node to the receiver based upon lack of presence of the negative voltage at the IO node;

wherein the pass gate circuit comprises:

a third n-channel DMOS having a source coupled to the IO node, a drain coupled to the receiver, a body, and a gate coupled to a third control signal that is negative when the negative voltage is present at the IO node; and a second p-channel DMOS having a drain coupled to the source of the third n-channel DMOS, a source coupled to the drain of the third n-channel DMOS, and a gate coupled to receive a second control signal that is positive when the negative voltage is present at the IO node; and a transmit protection circuit configured to apply the negative voltage from the IO node to the gate of the first n-channel DMOS based upon the presence of the negative voltage at the IO node.

17. The electronic device of claim 16, further comprising a fourth n-channel DMOS having a drain coupled to the IO node, a source coupled to the body of the third n-channel DMOS, and a gate coupled to receive a first control signal that is negative when the negative voltage is present at the IO node.

* * * * *

UNITED STATES PATENT AND TRADEMARK OFFICE
CERTIFICATE OF CORRECTION

PATENT NO. : 10,748,890 B2  
APPLICATION NO. : 15/475270  
DATED : August 18, 2020  
INVENTOR(S) : Ravinder Kumar Page 1 of 1

It is certified that error appears in the above-identified patent and that said Letters Patent is hereby corrected as shown below:

In the Specification

At Column 4, Line 59, please replace the term [[ MN8 ]] with -- MN5 --.

Signed and Sealed this
Eighteenth Day of May, 2021

Drew Hirshfeld
*Performing the Functions and Duties of the*
*Under Secretary of Commerce for Intellectual Property and*
*Director of the United States Patent and Trademark Office*